United States Patent
Adachi

(10) Patent No.: US 7,545,085 B2
(45) Date of Patent: Jun. 9, 2009

(54) PIEZOELECTRIC ELEMENT AND ULTRASONIC ACTUATOR

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/886,097

(22) PCT Filed: Jan. 19, 2007

(86) PCT No.: PCT/JP2007/050812

§ 371 (c)(1),
(2), (4) Date: Sep. 11, 2007

(87) PCT Pub. No.: WO2007/083752

PCT Pub. Date: Jul. 26, 2007

(65) Prior Publication Data

US 2008/0179996 A1 Jul. 31, 2008

(30) Foreign Application Priority Data

Jan. 23, 2006 (JP) ............................ 2006-013391

(51) Int. Cl.
*H01L 41/047* (2006.01)
(52) U.S. Cl. ...................................... 310/365; 310/366
(58) Field of Classification Search .......... 310/363–366
See application file for complete search history.

(56) References Cited

U.S. PATENT DOCUMENTS

| | | | | |
|---|---|---|---|---|
| 3,378,704 A | * | 4/1968 | Smith et al. | 310/366 |
| 6,140,747 A | * | 10/2000 | Saito et al. | 310/359 |
| 6,327,120 B1 | * | 12/2001 | Koganezawa et al. | 360/294.4 |
| 6,998,764 B2 | * | 2/2006 | Sasaki et al. | 310/365 |

(Continued)

FOREIGN PATENT DOCUMENTS

JP 5-3688 1/1993

(Continued)

OTHER PUBLICATIONS

Japanese Office Action, with English translation, issued in Japanese Patent Application No. JP 2007-525099, mailed Oct. 2, 2007.

*Primary Examiner*—Jaydi SanMartin
(74) *Attorney, Agent, or Firm*—McDermott Will & Emery LLP

(57) ABSTRACT

Internal electrode layers (5) include a common electrode layer (3) and feed electrode layers (6) alternately placed in a stacking direction with piezoelectric layers (1) interposed between the common electrode layer (3) and the feed electrode layers (6). The common electrode layer (3) has a common electrode (3*a*). The feed electrode layers (6) include a first feed electrode layer (6*a*) and a second feed electrode layer (6*b*). The first feed electrode layer (6) has a pair of electrically continuous first electrodes (2, 2) disposed on two areas (A2, A4) opposed along a first-diagonal-line direction (D1) of the principal surface of the associated piezoelectric layer (1) among four areas (A1 through A4) defined by dividing the principal surface of the associated piezoelectric layer (1) into two parts in the longitudinal and transverse directions (L) and (S). The second feed electrode layer (6) has a pair of electrically continuous second electrodes (4, 4) disposed on two areas (A1, A3) opposed along a second-diagonal-line direction (D2) of the principal surface of the associated piezoelectric layer (1) among the four areas (A1 through A4). The common electrode (3*a*), the first electrodes (2, 2), and the second electrodes (4, 4) are connected to associated external electrodes (7*g*, 7*b*, 7*a*).

11 Claims, 14 Drawing Sheets

U.S. PATENT DOCUMENTS

| | | | |
|---|---|---|---|
| 7,352,116 B2 * | 4/2008 | Nakao et al. | 310/366 |
| 2004/0189155 A1 * | 9/2004 | Funakubo | 310/366 |
| 2006/0061241 A1 * | 3/2006 | Sasaki | 310/366 |
| 2007/0236106 A1 * | 10/2007 | Koc et al. | 310/366 |

FOREIGN PATENT DOCUMENTS

| | | |
|---|---|---|
| JP | 2000-295876 | 10/2000 |
| JP | 2000-308376 | 11/2000 |
| JP | 2003-501988 | 1/2003 |
| JP | 2004-187334 | 7/2004 |
| JP | 2004297951 A * | 10/2004 |
| JP | 2004-320980 | 11/2004 |
| JP | 2006-187112 | 7/2006 |
| WO | WO 00/74153 A1 | 12/2000 |

* cited by examiner

8(110)
12(100)

PIEZOELECTRIC ELEMENT AND ULTRASONIC ACTUATOR

RELATED APPLICATIONS

This application is the U.S. National Phase under 35 U.S.C. § 371 of International Application No. PCT/JP2007/050812, filed on Jan. 19, 2007, which in turn claims the benefit of Japanese Application No. 2006-013391, filed on Jan. 23, 2006, the disclosures of which Applications are incorporated by reference herein.

TECHNICAL FIELD

The present invention relates to piezoelectric elements and ultrasonic actuators including the same.

BACKGROUND ART

An ultrasonic actuator has been conventionally known which is for use in various electronic devices or other devices and includes a piezoelectric element (electromechanical transducer) (see, for example, Patent Document 1). This piezoelectric element is obtained by alternately stacking piezoelectric bodies and electrodes. For the ultrasonic actuator, the piezoelectric element is vibrated by applying voltages to the electrodes, thereby moving a movable object.

Patent Document 1: Japanese Unexamined Patent Application Publication (Translation of PCT Application) No. 2003-501988

DISCLOSURE OF THE INVENTION

Problems that the Invention is to Solve

The present inventor invented the following ultrasonic actuator. FIG. 16 is a perspective view of the ultrasonic actuator. FIG. 17(*a*) is a perspective view of a piezoelectric element for use in the ultrasonic actuator. FIG. 17(*b*) is an exploded perspective view of the piezoelectric element.

As illustrated in FIGS. 16 and 17, a piezoelectric element 100 is contained in a case 103 and supported by three supporting members 104A through 104C disposed on the case 103. Drivers 110, 110 are disposed on one of end surfaces of the piezoelectric element 100 to support a movable object 111 and pressed against the movable object 111 by the supporting member 104B.

The piezoelectric element 100 is obtained by alternately stacking piezoelectric bodies 101 and internal electrodes 102. The internal electrode 102G is a common electrode (ground electrode) substantially entirely formed on a principal surface of an associated one of the piezoelectric bodies 101. The piezoelectric bodies 101 are polarized in the directions shown by the arrows in FIG. 17.

The internal electrodes 102A through 102D and 102G are connected to external electrodes 103A through 103D and 103G, respectively. The external electrodes 103A through 103D and 103G are disposed on the end surfaces of the piezoelectric element 100. For example, wires 108A through 108D and 108G are connected through solders 107 to the external electrodes 103A through 103D and 103G, respectively. Voltages are supplied through these wires 108A through 108D and 108G to the internal electrodes 102A through 102D and 102G, respectively.

Meanwhile, the resonance frequencies of later-described stretching and bending vibrations of the piezoelectric element 100 are determined by the material and shape of the piezoelectric element 100 and other factors. The material and shape of the piezoelectric element 100 and other factors are determined such that the resonance frequency of the stretching vibration generally coincides with that of the bending vibration.

The motions of the ultrasonic actuator will be described hereinafter. FIGS. 6 through 8 are conceptual diagrams for explaining the geometries of the vibrating piezoelectric element.

The wire 108G is connected to the ground. A sinusoidal reference voltage of a specific frequency is applied through the wires 108A and 108C to the internal electrodes 102A and 102C arranged along one of the diagonal lines across a principal surface of an associated one of the piezoelectric bodies 101. A sinusoidal voltage having substantially the same magnitude and frequency as the reference voltage is applied through the wires 108B and 108D to the internal electrodes 102B and 102D arranged along the other diagonal line. In view of the above, in-phase voltages are applied to the internal electrodes 102A and 102C, and in-phase voltages are applied to the internal electrodes 102B and 102D. When the difference in phase between the reference voltage and the voltage applied to each of the internal electrodes 102B and 102D is 0°, a primary mode of a stretching vibration is induced in the piezoelectric element 100 as illustrated in FIG. 6. On the other hand, when the above-mentioned difference in phase is 180°, a secondary mode of a bending vibration is induced in the piezoelectric element 100 as illustrated in FIG. 7.

When a sinusoidal reference voltage of a frequency close to the two generally coinciding resonance frequencies is applied to the internal electrodes 102A and 102C, and the sinusoidal voltage that is 90° or −90° out of phase with the reference voltage and has substantially the same magnitude and frequency as the reference voltage is applied to the internal electrodes 102B and 102D, the primary mode of the stretching vibration and the secondary mode of the bending vibration are harmonically induced in the piezoelectric element 100. This induction causes variations in the shape of the piezoelectric element 100 as illustrated in FIGS. 8(*a*), 8(*b*), 8(*c*), and 8(*d*) in this order. As a result, the drivers 110, 110 placed on the piezoelectric element 100 each produce a generally elliptical motion when viewed from the front of the paper of the drawing in FIG. 8. More particularly, the synthesis of the bending and stretching vibrations of the piezoelectric element 100 allows the drivers 110, 110 to each produce an elliptical motion. This elliptical motion allows the movable object 111 supported by the drivers 110, 110 to move relative to the piezoelectric element 100 in the direction shown by the arrow A or B.

Meanwhile, for the ultrasonic actuator, at least five wires 108A through 108D and 108G need to be connected to external electrodes 103A through 103D and 103G on the piezoelectric element 100. Therefore, the wires 108A through 108D and 108G and the solders 107 serving as conductive connecting members for providing connection between the wires 108A through 108D and 108G and the external electrodes 103A through 103D and 103G place burdens on vibration of the piezoelectric element 100, leading to the inhibited vibration thereof. As a result, the efficiency of the ultrasonic actuator may be reduced.

The present invention is made in view of the above, and its object is to restrain vibration of a piezoelectric element from being inhibited.

Means of Solving the Problems

In order to achieve the above object, the present invention provides a piezoelectric element obtained by alternately stacking generally rectangular piezoelectric layers and internal electrode layers configured as follows: The internal electrode layers include a common electrode layer and feed electrode layers alternately placed in a stacking direction with the piezoelectric layers interposed between the common electrode layer and the feed electrode layers; the common electrode layer has a common electrode; the feed electrode layers include a first feed electrode layer disposed on a principal surface of one of the piezoelectric layers and a second feed electrode layer disposed on a principal surface of one of the piezoelectric layers different from the piezoelectric layer on the principal surface of which the first feed electrode layer is disposed; the first feed electrode layer has a pair of electrically continuous first electrodes disposed on two areas opposed along a first-diagonal-line direction of the principal surface of the associated piezoelectric layer among four areas defined by dividing the principal surface of the associated piezoelectric layer into two parts in the longitudinal and transverse directions; the second feed electrode layer has a pair of electrically continuous second electrodes disposed on two areas opposed along a second-diagonal-line direction of the principal surface of the associated piezoelectric layer among the four areas; and the common electrode, the first electrodes, and the second electrodes are connected to associated external electrodes disposed on outer surfaces of the piezoelectric element.

EFFECTS OF THE INVENTION

According to the present invention, a pair of first electrodes of a first feed electrode layer disposed on two areas opposed along a first-diagonal-line direction of a principal surface of an associated one of piezoelectric layers among four areas defined by dividing the principal surface of the associated piezoelectric layer into two parts in the longitudinal and transverse directions are electrically connected to each other, and a pair of second electrodes of a second feed electrode layer disposed on two areas opposed along a second-diagonal-line direction of the principal surface of the associated piezoelectric layer among the four areas are electrically connected to each other. This can reduce the number of wires or the like. As a result, vibration of the piezoelectric element can be restrained from being inhibited.

Furthermore, the number of man hours for connection between the wires or the like and the external electrodes can be reduced, thereby facilitating fabrication of an ultrasonic actuator. In particular, the piezoelectric element is mechanically weak. Therefore, when the wires or the like are connected to the external electrodes, mechanical stresses may lead to the broken piezoelectric element. However, when, as described above, the number of man hours for connection between the wires or the like and the external electrodes is reduced, the piezoelectric element is restrained from being broken in this connection process step.

Moreover, the number of the junction points between the wires or the like and the external electrodes can be reduced. This can improve the reliability of the ultrasonic actuator.

Figure 1:
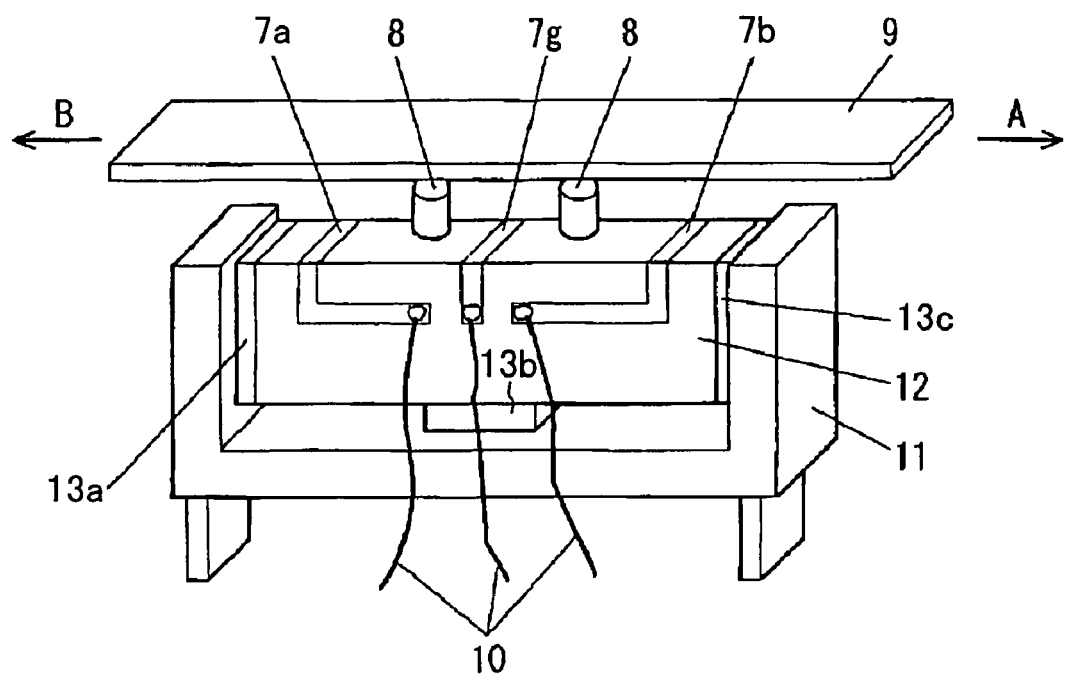
FIG. 1 is a perspective view of an ultrasonic actuator according to a first embodiment of the present invention.

DESCRIPTION OF REFERENCE NUMERALS 1 piezoelectric layer
2 first electrode
3 common electrode layer
3$a$ common electrode
4 second electrode
5 internal electrode
6 feed electrode layer
6$a$ first feed electrode layer
6$b$ second feed electrode layer
7 external electrode
7$a$ external electrode for second electrode
7$b$ external electrode for first electrode
7$g$ external electrode for common electrode
8$g$ driver
9 movable object
10 wire
11 case (supporter)
12, 21, 23, 33, 43 piezoelectric elements
13 through 13$c$ supporting members
22 first side electrode
24 second side electrode

BEST MODE FOR CARRYING OUT THE INVENTION

Embodiments of the present invention will be described hereinafter in details with reference to the drawings.

Embodiment 1

-Structure of Ultrasonic Actuator-

Figure 2:
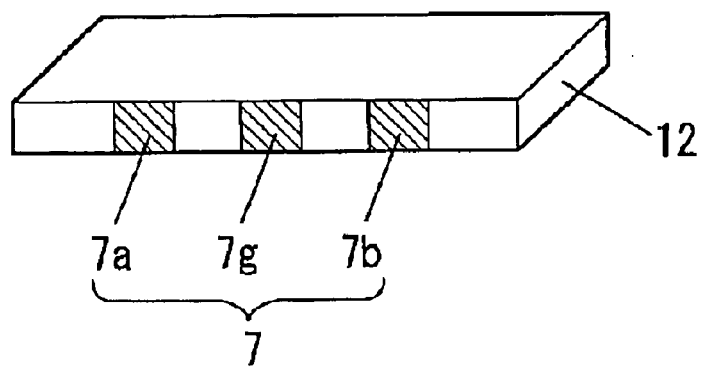
FIG. 2 is a perspective view of a piezoelectric element.
Figure 3:
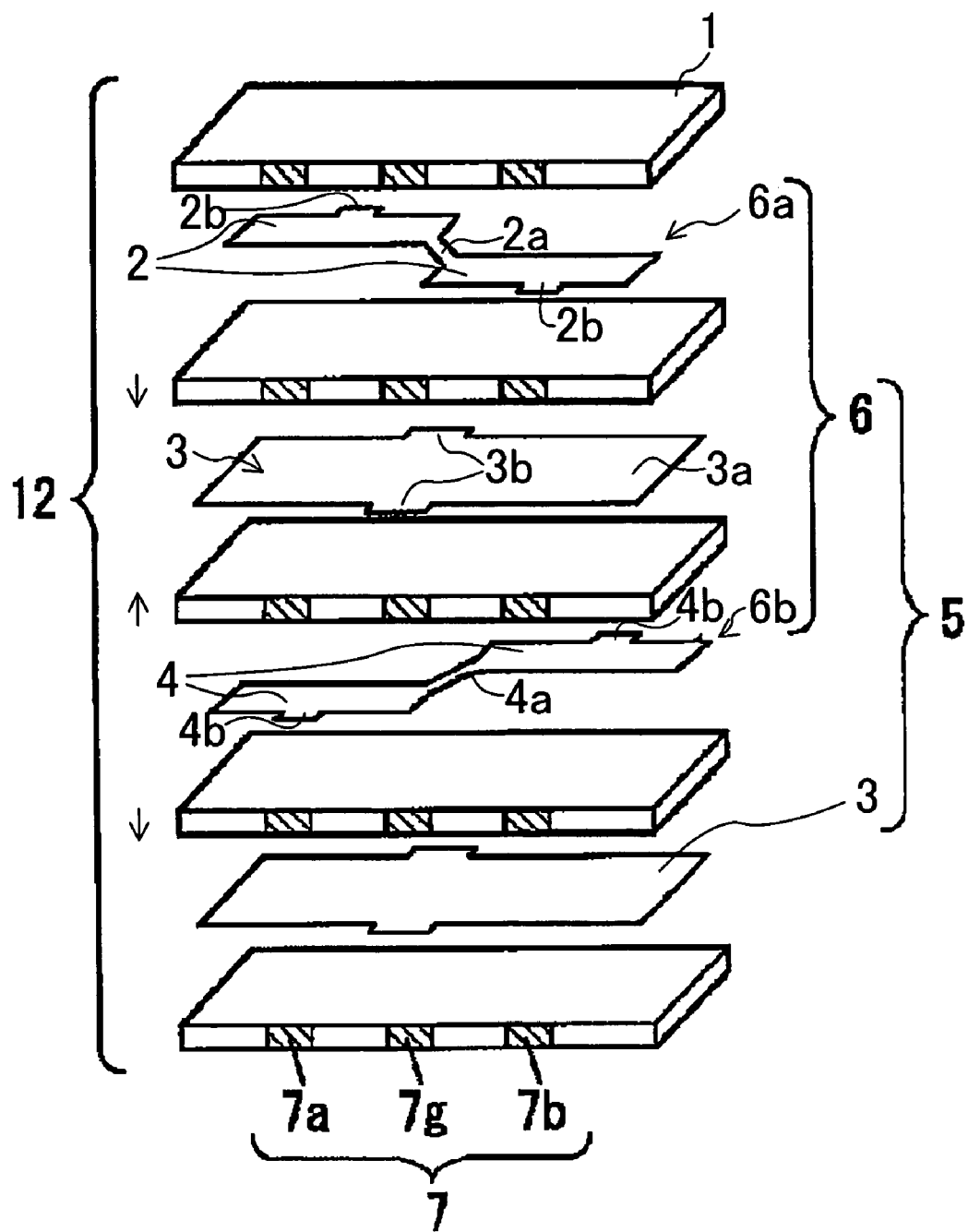
FIG. 3 is an exploded perspective view of the piezoelectric element.
Figure 4:
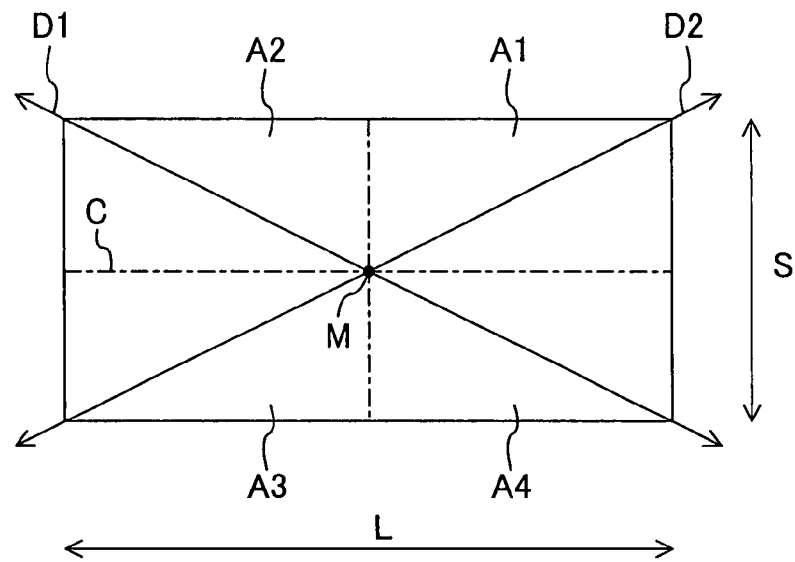
FIG. 4 is a plan view of a piezoelectric layer.
Figure 5A:
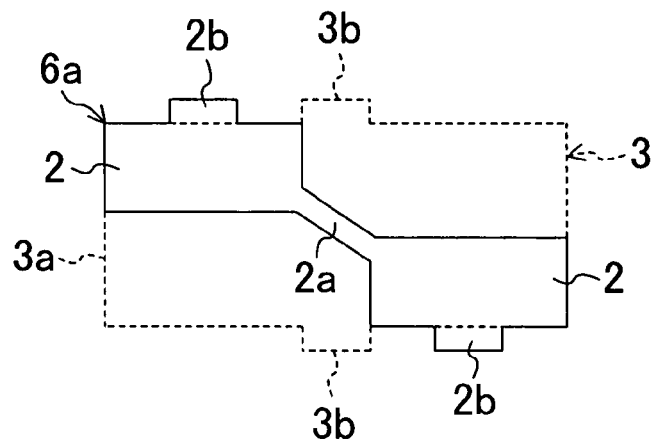
FIG. 5($a$) is a diagram illustrating the spatial relationship between a first feed electrode layer and a common electrode layer, and FIG. 5($b$) is a diagram illustrating the spatial relationship between a second feed electrode layer and a common electrode layer.
Figure 5B:
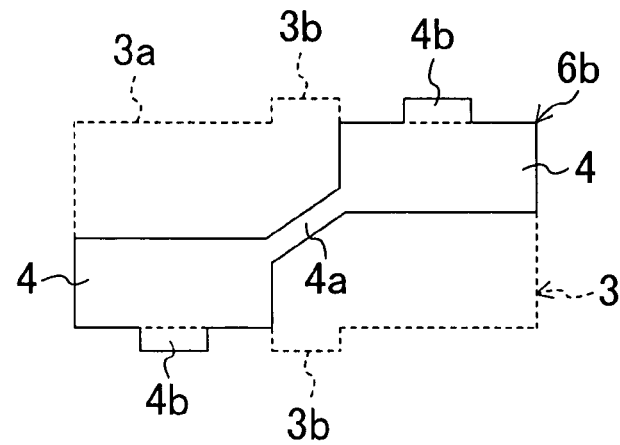

FIG. 1 is a perspective view of an ultrasonic actuator according to this first embodiment. FIG. 2 is a perspective view of a piezoelectric element 12 for use in the ultrasonic actuator. FIG. 3 is an exploded perspective view of the piezoelectric element 12. FIG. 4 is a plan view of a piezoelectric layer 1. FIG. 5(a) is a diagram illustrating the spatial relationship between a first feed electrode layer 6a and a common electrode layer 3, and FIG. 5(b) is a diagram illustrating the spatial relationship between a second feed electrode layer 6b and a common electrode layer 3.

As illustrated in FIGS. 1 through 3, the ultrasonic actuator includes a piezoelectric element 12. The piezoelectric element 12 has a pair of opposed principal surfaces, a pair of opposed end surfaces which are perpendicular to the principal surfaces and extend in the longitudinal direction of each principal surface of the piezoelectric element 12, and a pair of opposed side surfaces which are perpendicular to both the principal and end surfaces and extend in the transverse direction of each principal surface thereof. The principal, end and side surfaces form the outer surfaces of the piezoelectric element 12, and the end and side surfaces form the surrounding surfaces thereof. In this embodiment, the principal surfaces each have the largest area among the principal, end and side surfaces.

The piezoelectric element 12 is contained inside a case 11 (supporter) and supported by the case 11 with three supporting members 13a through 13c interposed therebetween. Drivers 8, 8 are disposed on one of the end surfaces of the piezoelectric element 12 to support a flat movable object 9. The supporting member 13b disposed on the other end surface of the piezoelectric element 12 (the end surface opposite to the end surface on which the drivers 8, 8 are disposed) presses the drivers 8, 8 against the movable object 9. This press increases the friction force between the distal ends of the drivers 8, 8 and the movable object 9, thereby transmitting vibration of the piezoelectric element 12 through the drivers 8, 8 to the movable object 9 with reliability.

The piezoelectric element 12 forms the shape of a generally rectangular parallelepiped and is obtained by alternately stacking generally rectangular piezoelectric layers 1 and internal electrode layers 5. Each piezoelectric layer 1 is an insulator layer made of a ceramic material, such as lead zirconium titanate. The internal electrode layers 5 include common electrode layers 3 and feed electrode layers 6 which are alternately arranged along the stacking direction of layers (along the thickness of the piezoelectric element 12) with the piezoelectric layers 1 interposed between the common electrode layers 3 and adjacent feed electrode layers 6. Each common electrode layer 3 has a generally rectangular common electrode 3a substantially entirely formed on the upper principal surface of the associated piezoelectric layer 1. The common electrode 3a is formed with lead electrodes 3b, 3b extending from a longitudinally middle part of the common electrode 3a toward both end surfaces of the piezoelectric element 12.

The feed electrode layers 6 include a first feed electrode layer 6a disposed on the upper principal surface of the associated piezoelectric layer 1 and a second feed electrode layer 6b disposed on the upper principal surface of the associated piezoelectric layer 1 different from the piezoelectric layer 1 on which the first feed electrode layer 6a is disposed. In other words, any one of the common electrode layers 3, the first feed electrode layer 6a and the second feed electrode layer 6b is printed on one of the principal surfaces of each piezoelectric layer 1. Furthermore, as illustrated by the arrows in FIG. 3, the piezoelectric layer 1 is polarized in the direction going from an associated one of the first feed electrode layer 6a and the second feed electrode layer 6b toward the associated common electrode layer 3.

The first feed electrode layer 6a has a pair of first electrodes 2, 2 which are electrically connected through a conduction electrode 2a to each other. The first electrodes 2, 2 are formed on two areas A2 and A4, respectively, opposed along the first-diagonal-line direction D1 of a first diagonal line across the upper principal surface of the associated piezoelectric layer 1 (the direction in which the first diagonal line extends) among four areas A1 through A4 (see FIG. 4) defined by dividing the upper principal surface of the associated piezoelectric layer 1 into two equal parts in both the longitudinal and transverse directions L and S. The first electrodes 2, 2 are generally rectangular electrodes and overlap the associated common electrode layer 3 when viewed in the stacking direction (see FIG. 5(a)). In other words, the first electrodes 2, 2 are opposed to the associated common electrode layer 3 with the associated piezoelectric layer 1 interposed therebetween. The conduction electrode 2a also overlaps the associated common electrode layer 3 when viewed in the stacking direction (see FIG. 5(a)). The first electrodes 2, 2 are formed with lead electrodes 2b, 2b extending from respective longitudinally middle parts of the first electrodes 2, 2 toward the associated end surfaces of the piezoelectric element 12. The lead electrodes 2b, 2b do not overlap the associated common electrode layer 3 when viewed in the stacking direction (see FIG. 5(a)). In other words, the lead electrodes 2b, 2b are not opposed to the associated common electrode layer 3. This prevents an electric field from being generated in parts of the piezoelectric layer 1 opposed to the lead electrodes 2b, 2b. In other words, the parts of the piezoelectric layer 1 become piezoelectrically inactive.

The second feed electrode layer 6b has a pair of second electrodes 4, 4 which are electrically connected through a conduction electrode 4a to each other. The first electrodes 4, 4 are formed on two areas A1 and A3, respectively, opposed along the second-diagonal-line direction D2 of a second diagonal line across the upper principal surface of the piezoelectric layer 1 (the direction in which the second diagonal line extends) among the four areas A1 through A4 defined by dividing the upper principal surface of the associated piezoelectric layer 1 into two equal parts in both the longitudinal and transverse directions L and S. The second electrodes 4, 4 are generally rectangular electrodes and overlap the associated common electrode layer 3 when viewed in the stacking direction (see FIG. 5(b)). The conduction electrode 4a also overlaps the associated common electrode layer 3 when viewed in the stacking direction (see FIG. 5(b)). The second electrodes 4, 4 are formed with lead electrodes 4b, 4b extending from respective longitudinally middle parts of the second electrodes 4, 4 toward the associated end surfaces of the piezoelectric element 12. The lead electrodes 4b, 4b do not overlap the associated common electrode layer 3 when viewed in the stacking direction (see FIG. 5(b)). This prevents an electric field from being generated in parts of the piezoelectric layer 1 opposed to the lead electrodes 4b, 4b.

The common electrodes 3a on the different piezoelectric layers 1 are connected through the associated lead electrode 3b and an external electrode 7g for the common electrodes to each other. The first electrodes 2, 2 are connected through the associated lead electrode 2b to an external electrode 7b for the first electrodes. The second electrodes 4, 4 are connected through the associated lead electrode 4b to an external electrode 7a for the second electrodes. The external electrodes 7a, 7b, and 7g are formed to partially cover one end surface and one principal surface of the piezoelectric element 12 and extend toward the vicinity of nodes of vibration of the piezoelectric element 12. Respective parts of the external electrodes 7a, 7b, and 7g located on the principal surface of the piezoelectric element 12 are connected through solders to wires 10. Thus, voltages are applied through the wires 10 to the internal electrode layers 5 to vibrate the piezoelectric element 12. When, as described above, the external electrodes 7a, 7b, and 7g are formed to partially cover one end surface and one principal surface of the piezoelectric element 12 and extend toward the vicinity of nodes of vibration of the piezoelectric element 12, this restrains the junction points between the piezoelectric element 12 and the wires 10 from adversely affecting the vibration.

Meanwhile, the resonance frequencies of stretching and bending vibrations of the piezoelectric element 12 are determined by the material and shape of the piezoelectric element 12 and other factors. The material and shape of the piezoelectric element 12 and other factors are determined such that the resonance frequency of the stretching vibration generally coincides with that of the bending vibration. In this embodiment, the material and shape of the piezoelectric element 12 and other factors are determined such that the resonance frequency of the primary mode of the stretching vibration generally coincides with that of the secondary mode of the bending vibration.

As described above, the electrodes 2 arranged along the diagonal-line direction D1 are electrically continuous with each other, the electrodes 4 arranged along the diagonal-line direction D2 are electrically continuous with each other, the common electrodes 3a on the different piezoelectric layers 1 are connected through the external electrode 7g to each other, the first electrodes 2, 2 on the associated piezoelectric layer 1 are connected to the external electrode 7b, and the second electrodes 4, 4 on the associated piezoelectric layer 1 are connected to the external electrode 7a. In view of the above, a total of three external electrodes 7, i.e., the external electrode 7g for the common electrodes, the external electrode 7b for the first electrodes, and the external electrode 7a for the second electrodes, need to be formed on the piezoelectric element 12. This can reduce the number of the wires 10 to be connected to the external electrodes 7 to three. As a result, vibration of the piezoelectric element 12 can be restrained from being inhibited, thereby suppressing a reduction in the efficiency of the ultrasonic actuator.

Furthermore, the number of man hours for connection between the wires 10 and the external electrodes 7 can be reduced, thereby facilitating fabrication of an ultrasonic actuator. In particular, the piezoelectric element 12 is mechanically weak. Therefore, when the wires 10 are connected to the external electrodes 7, mechanical stresses may lead to the broken piezoelectric element 12. When, to cope with this, the number of man hours for connection between the wires 10 and the external electrodes 7 is reduced as described above, the piezoelectric element 12 is restrained from being broken in this connection process step.

Moreover, the number of the junction points between the wires 10 and the external electrodes 7 can be reduced. This reduction can restrain the solders disposed on the junction points from inhibiting vibration of the piezoelectric element 12. Furthermore, these junction points are significant sections of the ultrasonic actuator for driving the ultrasonic actuator and susceptible to the external environment, such as variations in humidity and temperature. Therefore, when, as described above, the number of the junction points is reduced, this can improve the reliability of the ultrasonic actuator.

Moreover, for a small ultrasonic actuator (for example, an ultrasonic actuator having a piezoelectric element 12 whose length is approximately 0.1 mm through 10 mm), when electrodes of different potentials are formed on the feed electrode layers 6a and 6b, the distance between the electrodes of different potentials is not large enough. Thus, when high voltages are applied to the electrodes, a leakage current may be produced between the electrodes of different potentials. If a leakage current is produced, this causes loss of the supplied power, resulting in a reduction in the efficiency of the ultrasonic actuator. However, when the feed electrode layers 6a and 6b are configured as described above, only electrodes of the same potential are formed on the feed electrode layers 6a and 6b. As a result, a leakage current becomes less likely to be produced. This can achieve a small and efficient ultrasonic actuator.

In addition, the common electrodes 3a, the first electrodes 2 and the second electrodes 4 are connected through the lead electrodes 3b, 2b, and 4b to the external electrodes 7g, 7b, 7a, respectively. Therefore, the common electrodes 3a, the first electrodes 2 and the second electrodes 4 can be extended toward different parts of the surrounding surfaces of the piezoelectric element 12. This can ensure sufficiently large insulating distances between vertically adjacent ones of the common electrodes 3, the first electrodes 2 and the second electrodes 3. In view of the above, in order to provide sufficiently large insulating distances, the lead electrodes 3b, 2b and 4b of the electrodes 3a, 2 and 4 of different potentials are desirably spaced at intervals larger than the thickness of each piezoelectric layer 1.

Since, as described above, the common electrodes 3a, the first electrodes 2 and the second electrodes 4 are connected to the external electrodes 7g, 7b and 7a through the lead electrodes 3b, 2b and 4b placed on respective piezoelectrically inactive parts of the associated piezoelectric layers 1, this prevents the piezoelectric element 12 from unnecessarily vibrating. As a result, the piezoelectric element 12 vibrates in a balanced manner, resulting in the improved vibration efficiency.

Feed electrode layers 6 and other layers will be further described hereinafter.

The shape of a part of each of first feed electrode layers 6a formed of first electrodes 2, 2 and a conduction electrode 2a is point-symmetric with respect to the central point M on the upper principal surface of an associated piezoelectric layer 1 (see FIG. 4). The shape of a part of each of second feed electrode layers 6b formed of second electrodes 4, 4 and a conduction electrode 4a is also point-symmetric with respect to the central point M on the upper principal surface of another associated piezoelectric layer 1. In other words, the shape of a part of the first feed electrode layer 6a other than lead electrodes 2b and the shape of a part of the second feed electrode layer 6b other than lead electrodes 4b are each point-symmetric with respect to an intersection point of the first and second diagonal lines of the upper principal surface of the associated piezoelectric layer 1. When, as described above, the shape of each feed electrode layer 6 is generally point-symmetric with respect to the central point M on the upper principal surface of the associated piezoelectric layer 1, this improves the symmetry of the vibration of the piezoelectric element 12, in particular, the secondary mode of the bending vibration. This improvement prevents the piezoelectric element 12 from unnecessarily vibrating, resulting in sharply reduced energy loss. This reduction allows supplied power to be converted into vibrations with high efficiency.

The shape of the part of the first feed electrode layer 6a formed of the first electrodes 2, 2 and the conduction electrode 2a and the shape of the part of the second feed electrode layer 6b formed of the second electrodes 4, 4 and the conduction electrode 4a are identical with each other but inverse to each other with respect to the central line C (see FIG. 4) extending along the longitudinal direction L of the upper principal surface of each piezoelectric layer 1. In other words, the shape obtained by inverting the shape of the part of the first feed electrode layer 6a other than the lead electrodes 2b with respect to the central line C corresponds to the shape of the part of the second feed electrode layer 6b other than the lead electrodes 4b. When, as described above, the shape of the first feed electrode layer 6a and the shape of the second feed electrode layer 6b are identical with each other but inverse to each other with respect to the central line C, this improves the symmetry of the vibration of the piezoelectric element 12, in particular, the secondary mode of the bending vibration. This improvement prevents the piezoelectric element 12 from unnecessarily vibrating, resulting in sharply reduced energy loss. This reduction allows supplied power to be converted into vibrations with high efficiency.

The number of the first feed electrode layers 6a is equal to that of the second feed electrode layers 6b. This improves the symmetry of the vibration of the piezoelectric element 12. This improvement prevents the piezoelectric element 12 from unnecessarily vibrating, resulting in sharply reduced energy loss. This reduction allows supplied power to be converted into vibrations with high efficiency.

The feed electrode layers 6 are configured by alternately placing the first feed electrode layers 6a and the second feed electrode layers 6b along the stacking direction. This improves the symmetry of the vibration of a part of the piezoelectric element 12 in which the conduction electrodes 2a and 4a are located. This improvement prevents the piezoelectric element 12 from unnecessarily vibrating, resulting in sharply reduced energy loss. This reduction allows supplied power to be converted into vibrations with high efficiency.

The outermost layers of the piezoelectric element 12 in the stacking direction are piezoelectric layers 1. This provides the following effects. More particularly, on condition that a small ultrasonic actuator (for example, having a length of approximately 1 mm through 20 mm) is implemented in a very small space inside an electronic device, if the outermost layers of the piezoelectric element 12 are common electrode layers 3 or feed electrode layers 6, contact between the principal surfaces of the piezoelectric element 12 and a metal component around the principal surfaces thereof may cause a short circuit between the outermost electrode layers and the metal component. This short circuit may significantly degrade the characteristics of the ultrasonic actuator. When, to cope with this, as described above, the outermost layers of the piezoelectric element 12 in the stacking direction are piezoelectric layers 1 being insulators, this prevents a short circuit from being caused even with contact between the principal surfaces of the piezoelectric element 12 and a metal component. As a result, the reliability of the ultrasonic actuator can be improved.

-Operation of Ultrasonic Actuator-

Figure 6:
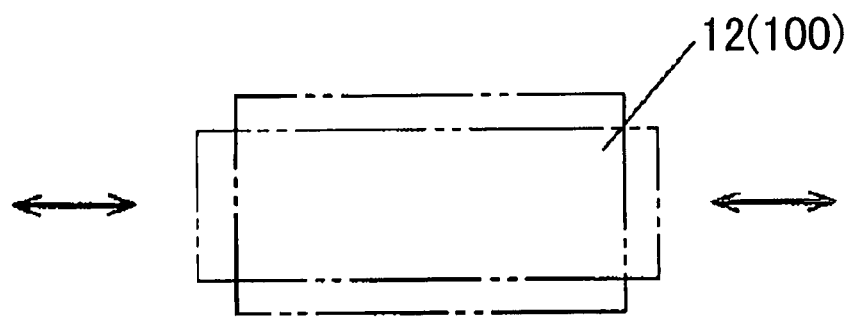
FIG. 6 is a displacement diagram of a primary mode of a stretching vibration.
Figure 7:
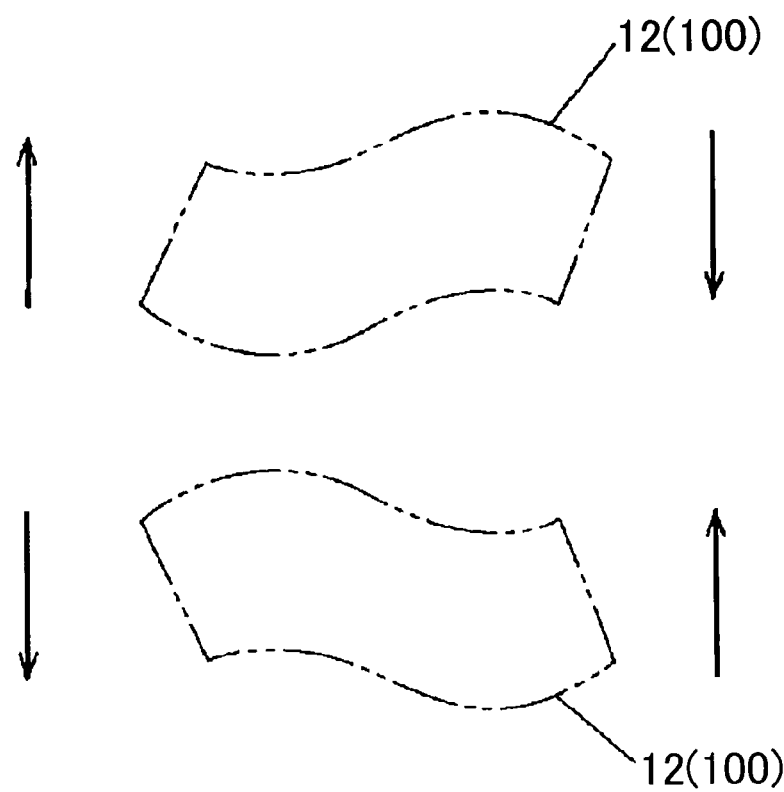
FIG. 7 is a displacement diagram of a secondary mode of a bending vibration.
Figure 8A:
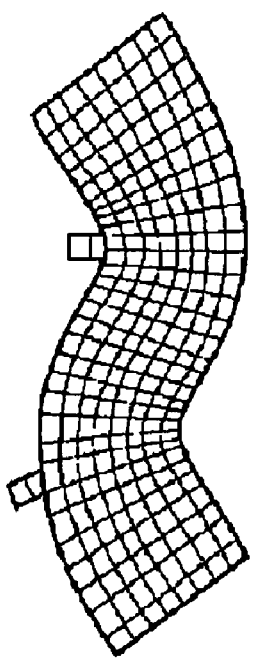
FIGS. 8 are conceptual diagrams for explaining the motions of a piezoelectric element.
Figure 8B:
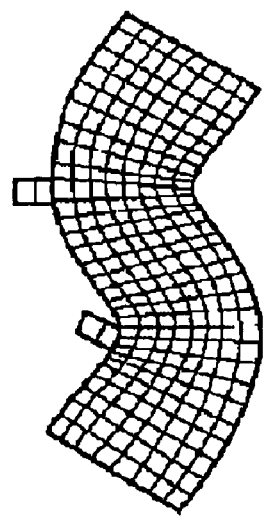
Figure 8C:
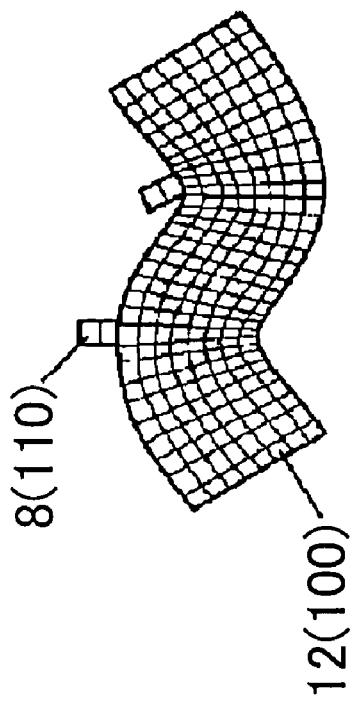
Figure 8D:
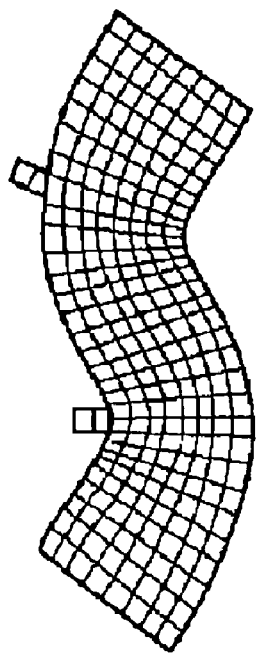

The operation of an ultrasonic actuator will be described hereinafter. FIG. 6 is a displacement diagram of a primary mode of a stretching vibration according to this embodiment. FIG. 7 is a displacement diagram of a secondary mode of a bending vibration. FIG. 8 are conceptual diagrams for explaining the motions of a piezoelectric element 12. In FIGS. 6 through 8, the principal surfaces of the piezoelectric element 12 are parallel to the papers of the drawings.

For example, when a reference alternating voltage of a frequency close to the two generally coinciding resonance frequencies is applied through a wire 10 between a common electrode layer 3 and an associated first feed electrode layer 6a, and the alternating voltage that is 90° or −90° out of phase with the reference alternating voltage and has substantially the same magnitude and frequency as the reference alternating voltage is applied through another wire 10 between the common electrode layer 3 and an associated second feed electrode layer 6b, the primary mode of the stretching vibration illustrated in FIG. 6 and the secondary mode of the bending vibration illustrated in FIG. 7 are harmonically induced in the piezoelectric element 12.

This induction causes variations in the shape of the piezoelectric element 12 as illustrated in FIGS. 8(a), 8(b), 8(c), and 8(d) in this order. As a result, the drivers 8, 8 placed on the piezoelectric element 12 each produce a generally elliptical motion when viewed from the front of the paper of the drawing in FIG. 8. More particularly, the synthesis of the bending and stretching vibrations of the piezoelectric element 12 allows the drivers 8, 8 to each produce an elliptical motion. This elliptical motion allows the movable object 9 supported by the drivers 8, 8 to move relative to the piezoelectric element 12 in the directions shown by the arrow A or B in FIG. 1.

The direction in which the piezoelectric element 12 is stretched by the stretching vibration corresponds to the longitudinal direction of the principal surfaces of the piezoelectric element 12, i.e., the direction in which the movable object 9 can move. The direction of the bending vibration corresponds to the direction in which the movable object 9 supports the drivers 8, 8. The stacking direction in which layers forming the piezoelectric element 12 are stacked corresponds to the direction vertical to both the direction in which the piezoelectric element 12 is stretched by the stretching vibration and the direction of the bending vibration.

Figure 9:
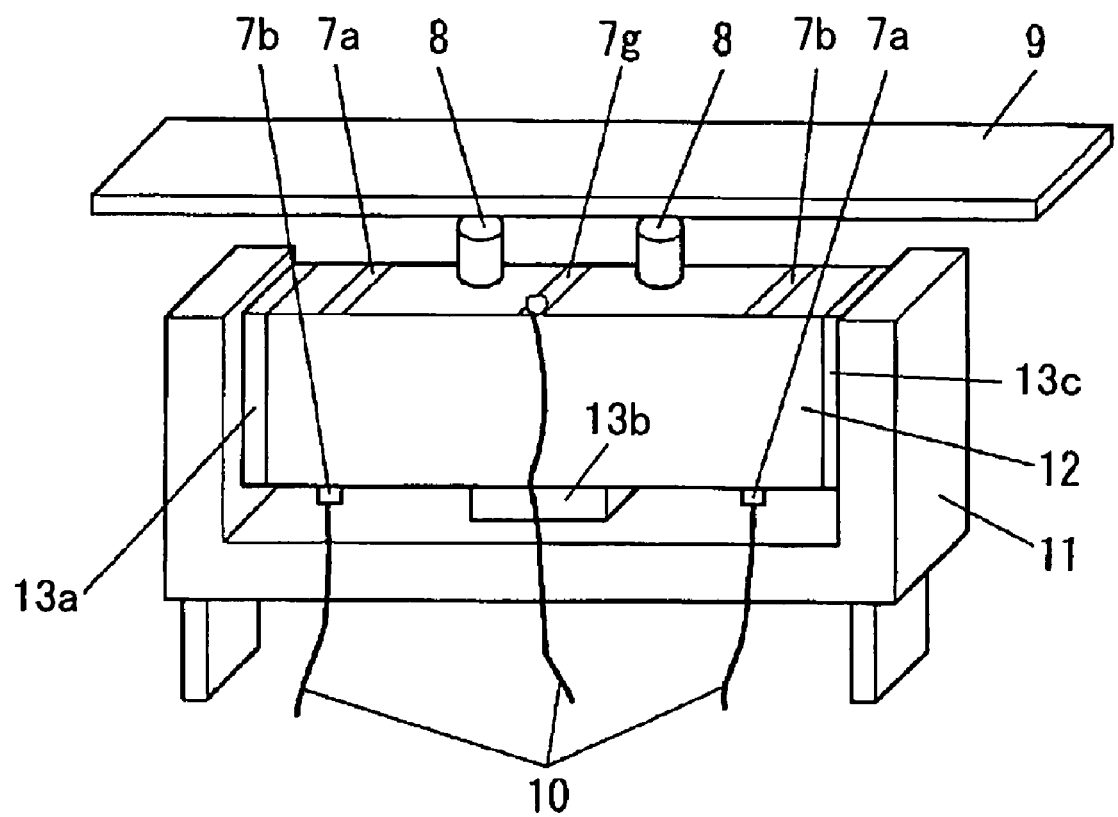
FIG. 9 is a perspective view of a modification of an ultrasonic actuator.

In this embodiment, external electrodes 7a, 7b and 7g are formed to partially cover one end surface and one principal surface of the piezoelectric element 12. However, as illustrated in FIG. 9, they may be formed only on the end surface of the piezoelectric element 12.

Embodiment 2

Figure 10:
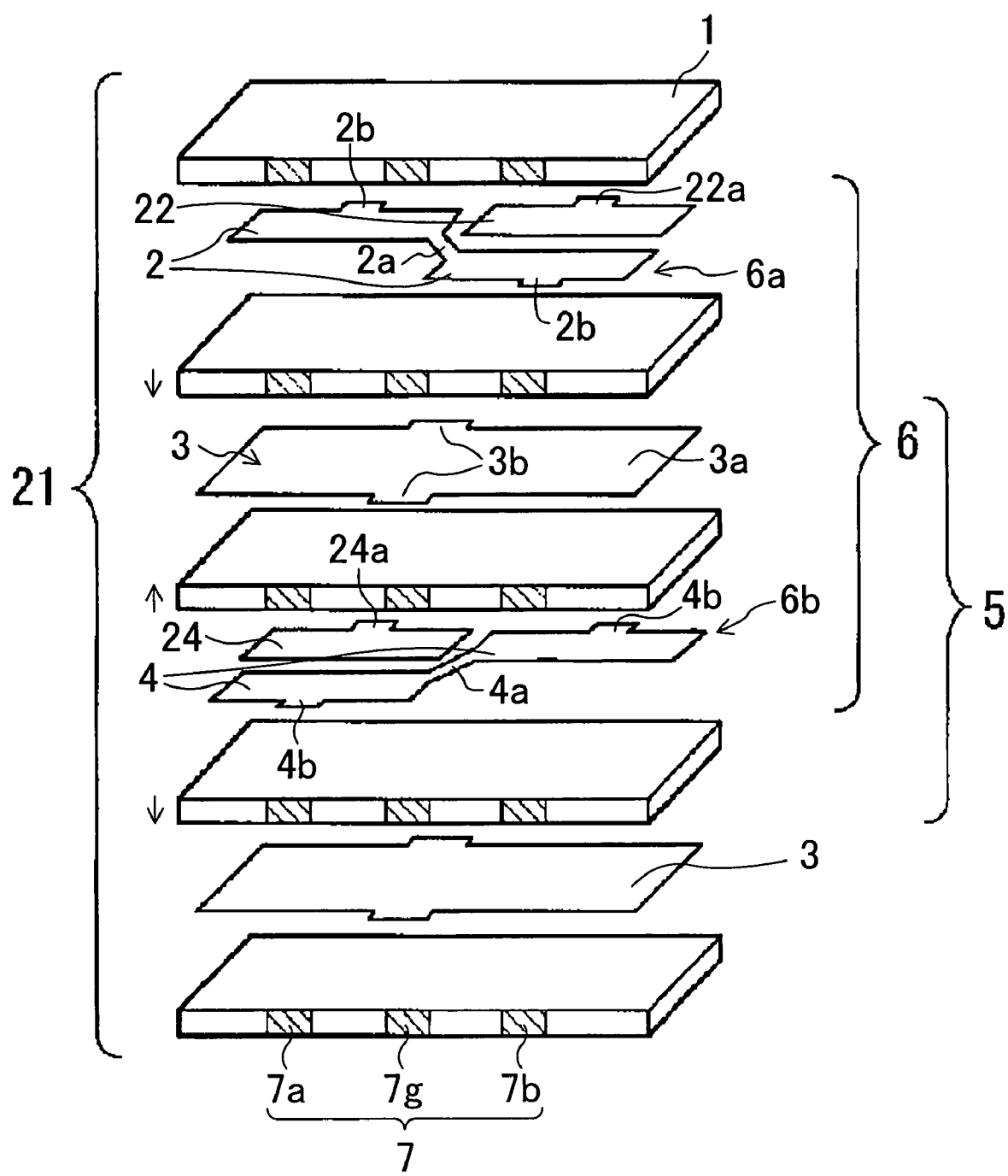
FIG. 10 is an exploded perspective view of a piezoelectric element according to a second embodiment.

This second embodiment is different from the first embodiment in the configuration of feed electrode layers 6. FIG. 10 is an exploded perspective view of a piezoelectric element 21 according to this second embodiment.

As illustrated in FIG. 10, a first feed electrode layer 6a has, in addition to a pair of first electrodes 2, 2, a first side electrode 22 located on one A1 of two areas A1 and A3 opposed along the second-diagonal-line direction D2. The first side electrode 22 is a generally rectangular electrode and overlaps an associated common electrode layer 3 when viewed in the stacking direction. The first side electrode 22 is provided with a lead electrode 22a extending from a longitudinally middle part of the first side electrode 22 toward an associated one of the end surfaces of the piezoelectric element 12. The lead electrode 22a does not overlap the associated common electrode layer 3 when viewed in the stacking direction. This prevents an electric field from being generated in a part of an associated piezoelectric layer 1 opposed to the lead electrode 22a.

A second feed electrode layer 6b has, in addition to a pair of second electrodes 4, 4, a second side electrode 24 located on one A2 of two areas A2 and A4 opposed along the first-diagonal-line direction D1. The second side electrode 24 is a generally rectangular electrode and overlaps an associated common electrode layer 3 when viewed in the stacking direction. The second side electrode 24 is provided with a lead electrode 24a extending from a longitudinally middle part of the second side electrode 24 toward an associated one of the end surfaces of the piezoelectric element 12. The lead electrode 24a does not overlap the associated common electrode layer 3 when viewed in the stacking direction. This prevents an electric field from being generated in a part of an associated piezoelectric layer 1 opposed to the lead electrode 24a.

The first electrodes 2, 2 are connected through the associated lead electrodes 2b and 24a and an associated one of external electrodes 7b for the first electrodes to the second side electrode 24, and the second electrodes 4, 4 are connected through the associated lead electrodes 4b and 22a and an associated one of external electrodes 7a for the second electrodes to the first side electrode 22. The external electrodes 7a are disposed on both end surfaces of the piezoelectric element 12, respectively, and the external electrodes 7b are also disposed on both end surfaces thereof, respectively. External electrodes 7g are also disposed on both end surfaces of the piezoelectric element 12, respectively.

When, as described above, the feed electrode layers 6 are formed with the side electrodes 22 and 24, this can increase the area of electrodes. This can increase the displacement of the piezoelectric element 21, resulting in the improved efficiency of an ultrasonic actuator.

In this embodiment, the first side electrode 22 and the second side electrode 24 may each be generally bilaterally symmetric with respect to the central line C extending along the longitudinal direction L of the upper principal surface of the associated piezoelectric layer 1. In this case, the shape of the part of the first feed electrode layer 6a formed of the first electrodes 2, 2, the conduction electrode 2a, and the first side electrode 22 and the shape of the part of the second feed electrode layer 6b formed of the second electrodes 4, 4, the conduction electrode 4a, and the second side electrode 24 are identical with each other but are inverse to each other with respect to the central line C extending along the longitudinal direction L of the upper principal surface of each piezoelectric layer 1.

Embodiment 3

Figure 11A:
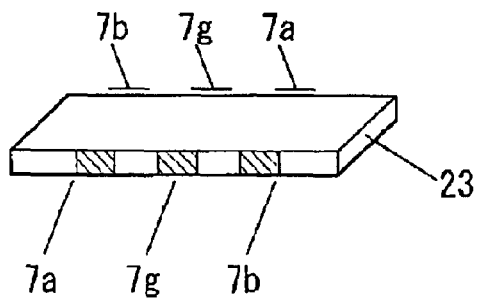
FIG. 11($a$) is a perspective view of a piezoelectric element according to a third embodiment, and FIG. 11($b$) is an exploded perspective view of the piezoelectric element.
Figure 11B:
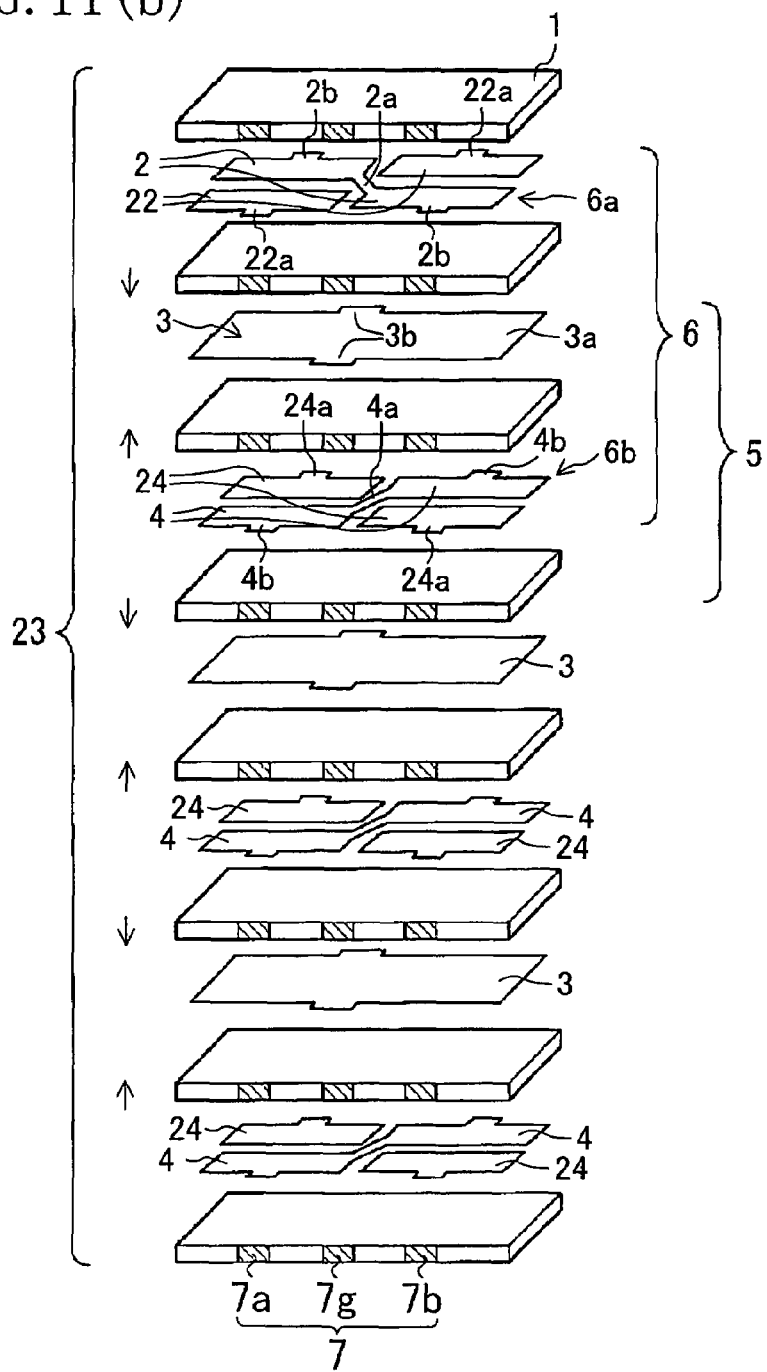
Figure 12:
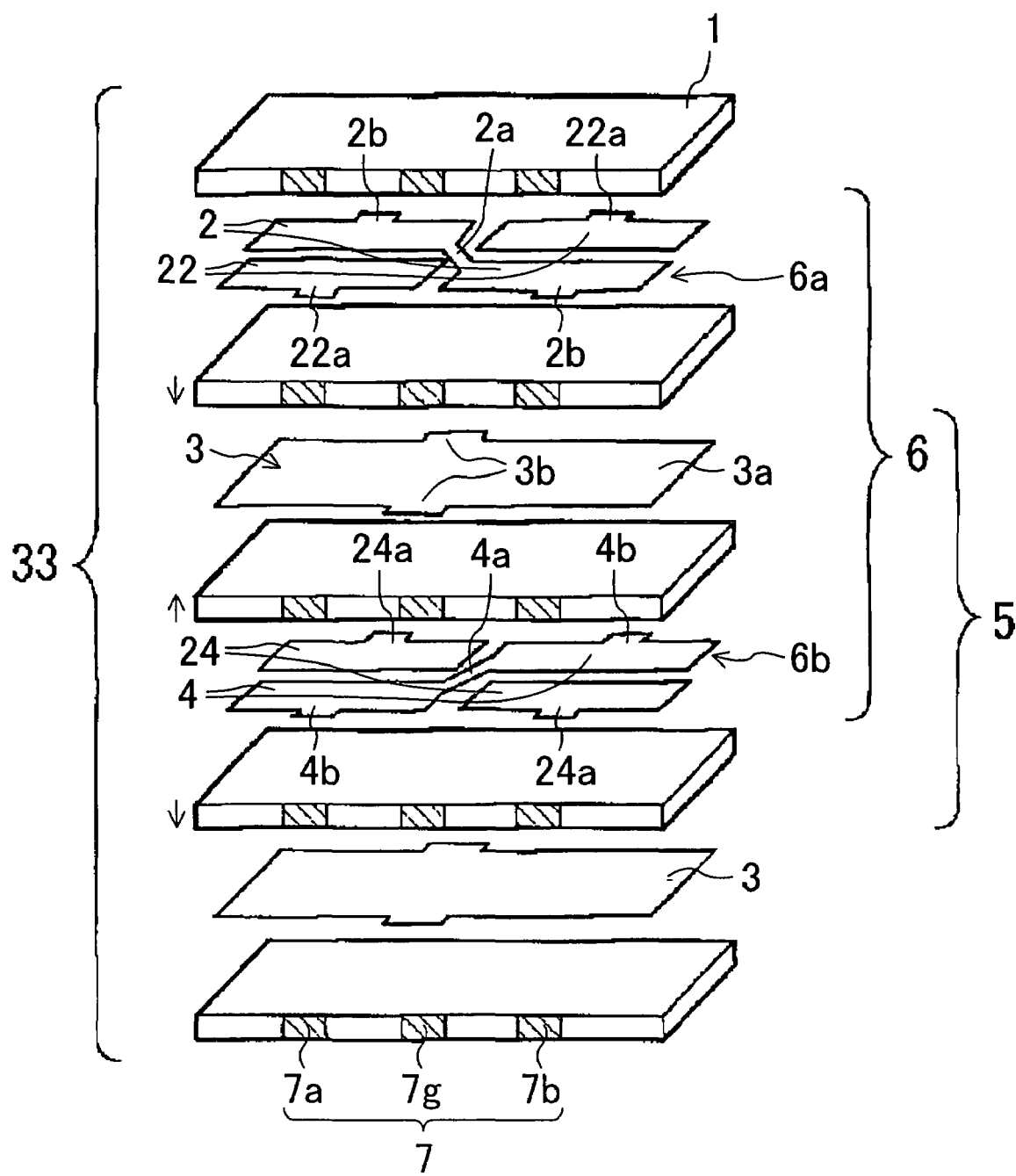
FIG. 12 is an exploded perspective view of a piezoelectric element.

This third embodiment is different from the first and second embodiments in the configuration of feed electrode layers 6. FIG. 11(a) is a perspective view of a piezoelectric element 23 according to this third embodiment, and FIG. 11(b) is an exploded perspective view of the piezoelectric element 23. FIG. 12 is an exploded perspective view of a piezoelectric element 33.

As illustrated in FIG. 11, a first feed electrode layer 6a has, in addition to a pair of first electrodes 2, 2, a pair of first side electrodes 22, 22 respectively located on two areas A1 and A3 opposed along the second-diagonal-line direction D2.

A second feed electrode layer 6b has, in addition to a pair of second electrodes 4, 4, a pair of second side electrodes 24 respectively located on two areas A2 and A4 opposed along the first-diagonal-line direction D1.

When, as described above, the feed electrode layers 6 are formed with the side electrodes 22 and 24, this can increase the area of electrodes. This can increase the displacement of the piezoelectric element 23, resulting in the improved efficiency of an ultrasonic actuator.

In order to induce a secondary mode of a bending vibration with high efficiency, a pair of electrodes disposed on diagonal parts of the upper principal surface of an associated piezoelectric layer 1, respectively, are desirably at the same potential. To satisfy this, as illustrated in FIG. 11, the first electrodes 2, 2 are connected through external electrodes 7b, 7b for the first electrodes, which are disposed on both end surfaces of the piezoelectric element 23, respectively, to the second side electrodes 24, 24 on another piezoelectric layer 1, and the second electrodes 4, 4 on the piezoelectric layer 1 are connected through external electrodes 7a, 7a for the second electrodes, which are disposed on both end surfaces of the piezoelectric element 21, respectively, to the first side electrodes 22, 22. In other words, the electrodes 2, 2, 22, 22 of the first feed electrode layer 6a are connected through the external electrodes 7a and 7b to the associated electrodes 4, 4, 24, 24 of the second feed electrode layer 6b which are opposed to the electrodes 2, 2, 22, 22. In this manner, the first electrodes 2 are electrically connected through the external electrodes 7b to the second side electrodes 24 so that the first electrodes 2 and the second side electrodes 24 are at the same potential, and the second electrodes 4 are electrically connected through the external electrodes 7a to the first side electrodes 22 so that the second electrodes 4 and the first side electrodes 22 are at the same potential. Consequently, a pair of electrodes disposed on diagonal parts of the upper principal surface of a piezoelectric layer 1 can be at the same potential. In this case, two external electrodes 7a need to be formed on both end surfaces of the piezoelectric element 23, respectively, and two external electrodes 7b need to be formed on both end surfaces of the piezoelectric element 23, respectively. That is, four external electrodes need to be formed. Meanwhile, only the external electrodes 7a and 7b located on one of the end surfaces of the piezoelectric element 23 need to be connected to wires 10. The piezoelectric element 23 is connected to the wires 10 at the following three locations: A total of two locations between the external electrode 7a and an associated one of the wires 10 and between the external electrode 7b and an associated one of the wires 10 and one location between the external electrode 7g for the common electrode and an associated one of the wires 10.

Furthermore, external electrodes 7g are formed on both end surfaces of the piezoelectric element 23, respectively. Therefore, the directivity of the piezoelectric element 23 is eliminated, thereby eliminating the need for appropriately adjusting the locations of the drivers 8, 8 and the piezoelectric element 23 when drivers 8, 8 are placed on the piezoelectric element 23. As a result, the number of ultrasonic actuators produced is increased. An external electrode 7g may be formed only on one end surface of the piezoelectric element 23.

The shape of the first feed electrode layer 6a formed of the first electrodes 2, 2, a conduction electrode 2a and the first side electrodes 22, 22 and the shape of the second feed electrode layer 6b formed of the second electrodes 4, 4, a conduction electrode 4a and the second side electrodes 24, 24 are point-symmetric with respect to the central points M on the upper principal surfaces of the associated piezoelectric layers 1 on which the feed electrode layers 6a and 6b are formed, respectively. In other words, the shape of a part of the first feed electrode layer 6a other than lead electrodes 2b and the shape of a part of the second feed electrode layer 6b other than lead electrodes 4b are each point-symmetric with respect to an intersection point of the first and second diagonal lines of the upper principal surface of the associated piezoelectric layer 1.

The shape of the part of the first feed electrode layer 6a formed of the first electrodes 2, 2, the conduction electrode 2a and the first side electrodes 22, 22 and the shape of the part of the second feed electrode layer 6b formed of the second electrodes 4, 4, the conduction electrode 4a and the second side electrodes 24, 24 are identical with each other but inverse to each other with respect to the central line C (see FIG. 4) extending along the longitudinal direction L of the upper principal surface of a piezoelectric layer 1. In other words, the shape of the part of the first feed electrode layer 6a other than the lead electrodes 2b and the shape of the part of the second feed electrode layer 6b other than the lead electrodes 4b are identical with each other but inverse to each other with respect to the central line C.

As illustrated in FIG. 11(b), the feed electrode layers 6 may be configured such that several first feed electrode layers 6a or several second feed electrode layers 6b are successively placed in the stacking direction. Alternatively, first feed electrode layers 6a and second feed electrode layers 6b may be randomly placed. However, as illustrated in FIG. 12, the number of first feed electrode layers 6a is desirably equal to that of second feed electrode layers 6b, and feed electrode layers 6 is desirably configured such that the first feed electrode layers 6a and the second feed electrode layers 6b are alternately placed.

Other Embodiments

In the above embodiments, external electrodes 7 are desirably formed only on the surrounding surfaces of the piezoelectric elements 12, 21, 23, and 33 so as to be prevented from being formed on the principal surfaces thereof. Since, in this case, external electrodes 7 are not formed on the principal surfaces of the piezoelectric elements 12, 21, 23, and 33 which have the largest area among the outer surfaces of the piezoelectric elements 12, 21, 23, and 33, a short circuit becomes less likely to be caused even with contact between the principal surfaces of the piezoelectric elements and a metal component around the principal surfaces. Furthermore, since no electric field is generated between external electrodes 7 and common electrode layers 3, this prevents the piezoelectric elements 12, 21, 23, and 33 from unnecessarily vibrating, thereby suppressing a reduction in the efficiency of the ultrasonic actuator.

In the above embodiments, first electrodes 2, second electrodes 4, first side electrodes 22, and second side electrodes 24 are generally rectangular. However, this is not restrictive. These electrodes may be shaped, for example, according to the distribution of stresses due to vibrations.

In the above embodiments, the configuration in which wires 10 are connected through solders to external electrodes 7 was described. However, wires 10 may be connected to external electrodes 7 using any other electrical connection method, such as a connection method using wire bonding, a connection method using a conductive adhesive, a connection method using a crimping method, or a connection method using contact between the wires 10 and the external electrodes 7. This can provide the same effect as in the above embodiments.

In the above embodiments, the case where power is supplied through wires 10 to an ultrasonic actuator was described. However, power may be supplied to an ultrasonic actuator using any other power supply method, such as a method for supplying power through conductive rubber, a method for supplying power through a flexible substrate, or a method for supplying power through a contact pin. This can provide the same effect as in the above embodiments.

Figure 13:
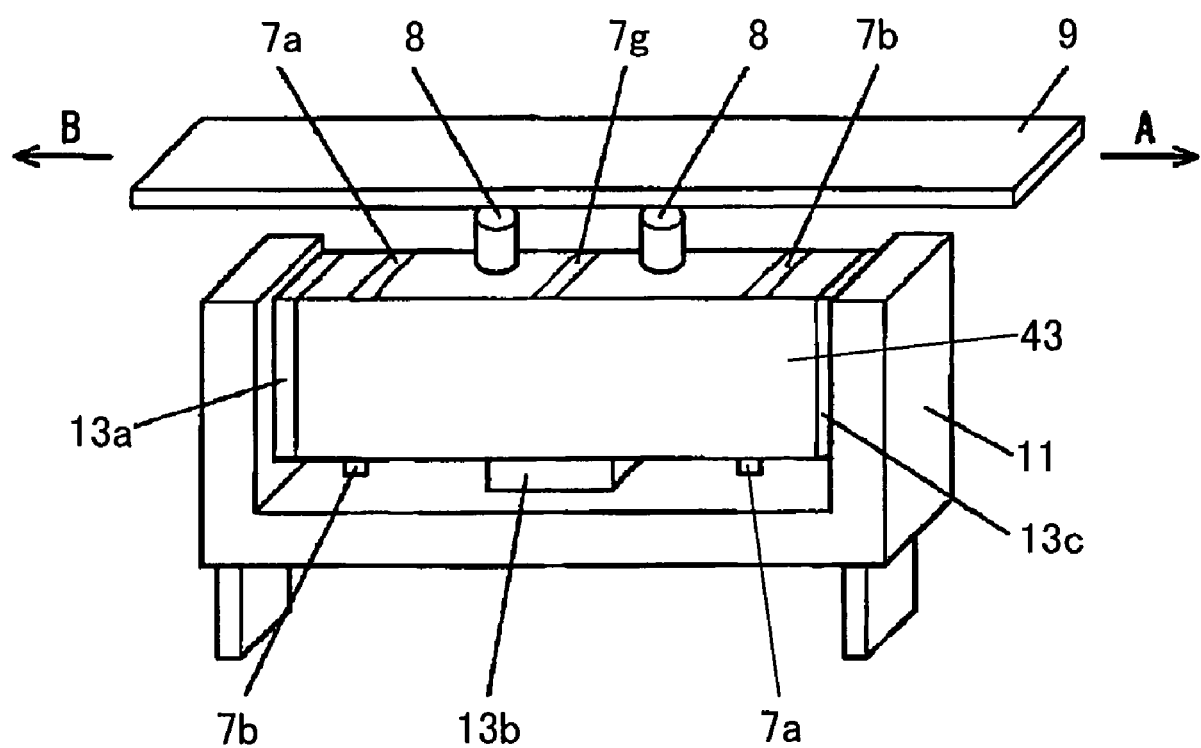
FIG. 13 is a perspective view of a modification of an ultrasonic actuator.
Figure 14A:
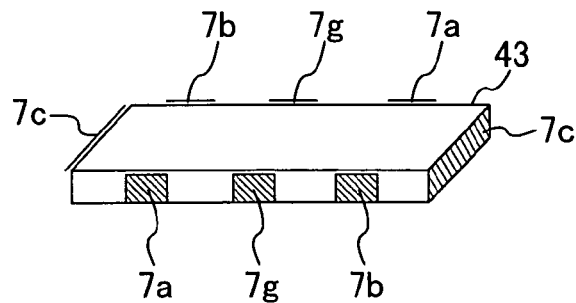
FIG. 14($a$) is a perspective view of a piezoelectric element, and FIG. 14($b$) is an exploded perspective view of the piezoelectric element.
Figure 14B:
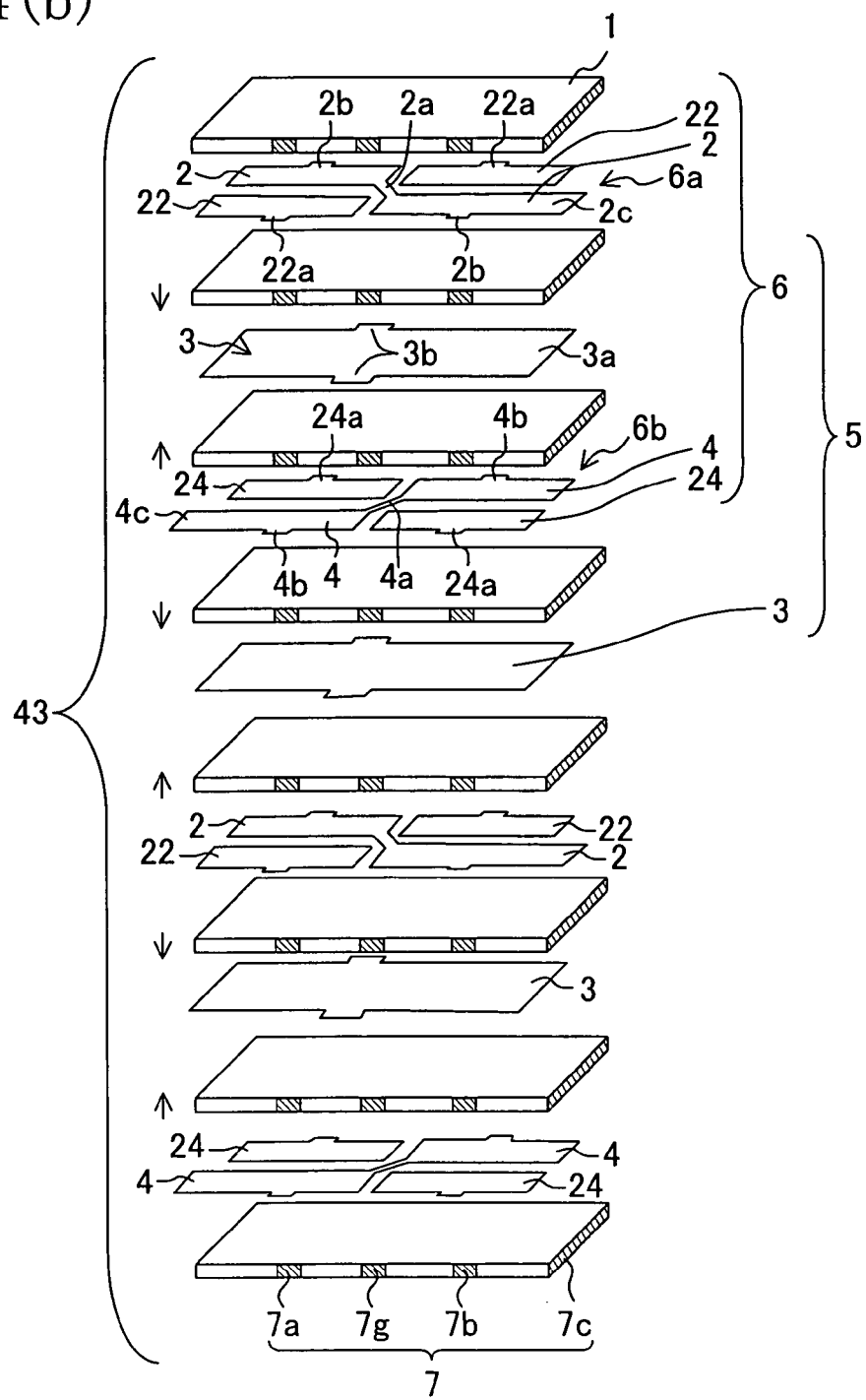

An example of power supply through conductive rubber will be described hereinafter. As illustrated in FIGS. 13 and 14, supporting members 13a through 13c are made of conductive rubber obtained by mixing metal particles into silicone rubber. One of first electrodes 2 on the area A4 (see FIG. 4) is provided with a lead electrode 2c extending from the first electrode 2 toward the associated side surface of a piezoelectric element 43. One of second electrodes 4 on the area A3 (see FIG. 4) is provided with a lead electrode 4c extending from the second electrode 4 toward the other associated side surface of the piezoelectric element 43. External electrodes 7c are disposed on both side surfaces of the piezoelectric element 43, respectively. Common electrodes 3a are connected through one of external electrodes 7g to the supporting member 13b. The first electrode 2, 2 and second side electrodes 24, 24 are connected through the lead electrode 2c and an associated one of the external electrodes 7c to the supporting member 13c. The second electrodes 4, 4 and second side electrodes 22, 22 are connected through the lead electrode 4c and an associated one of the external electrodes 7c to the supporting member 13a. Thus, voltages are applied through these supporting members 13a through 13c and other elements to internal electrode layers 5. This embodiment is substantially the same as the third embodiment in terms of the other points. In view of the above, the need for placing solders on the piezoelectric element 43 is eliminated. This elimination can restrain the piezoelectric element 43 from being cracked due to concentration of stresses arising from vibrations on parts of the piezoelectric element 43 provided with solders.

Figure 15:
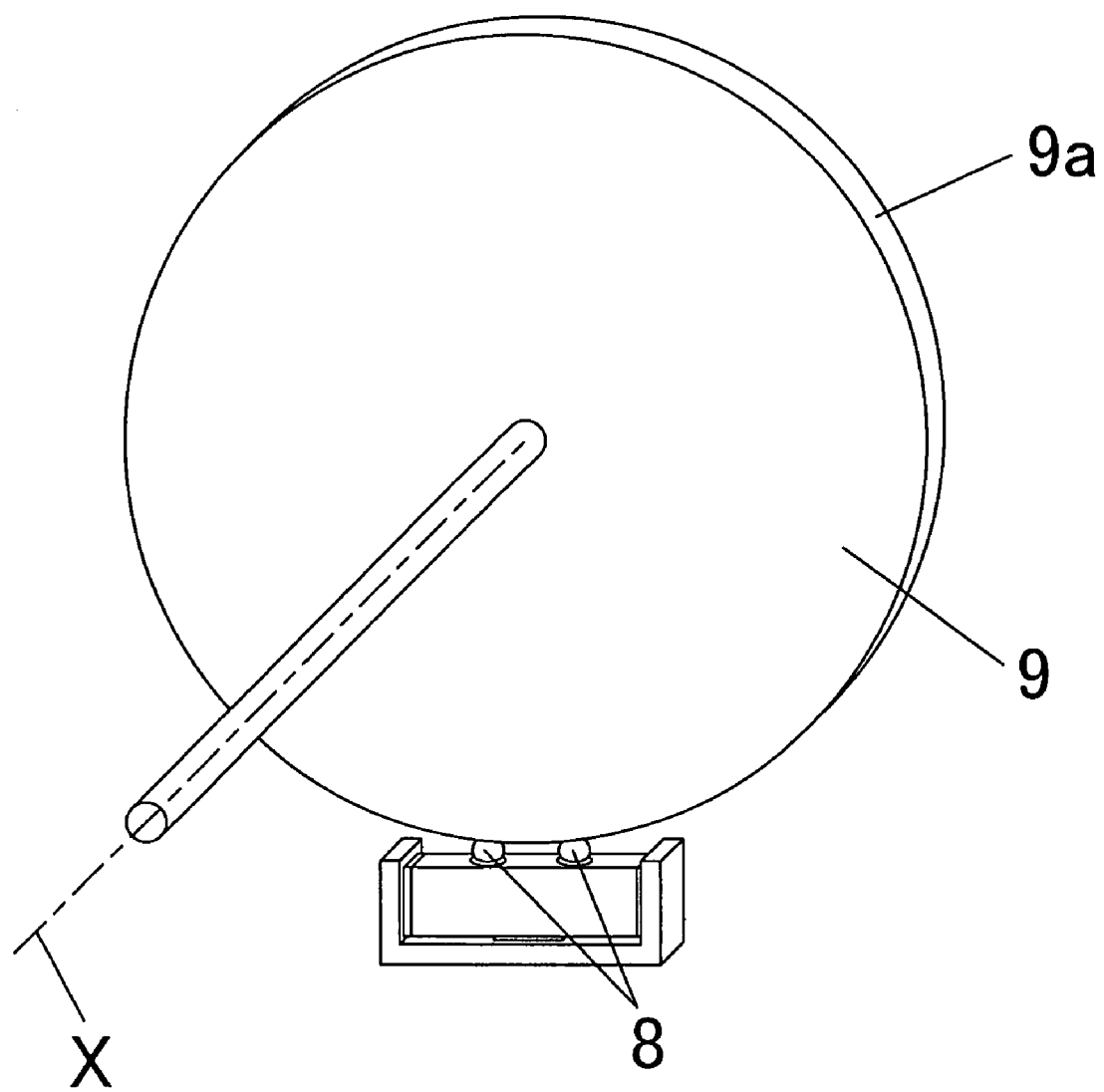
FIG. 15 is a perspective view of a modification of an ultrasonic actuator.
Figure 16:
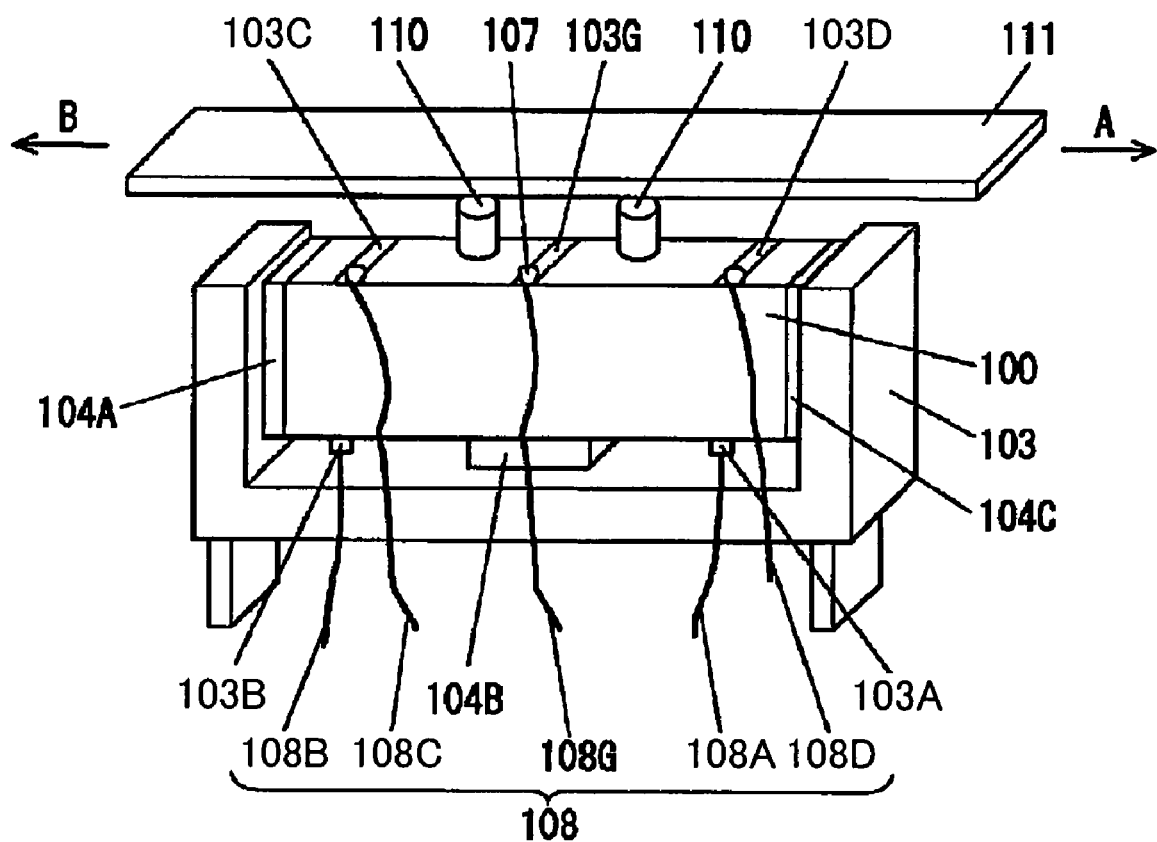
FIG. 16 is a perspective view of an ultrasonic actuator.
Figure 17A:
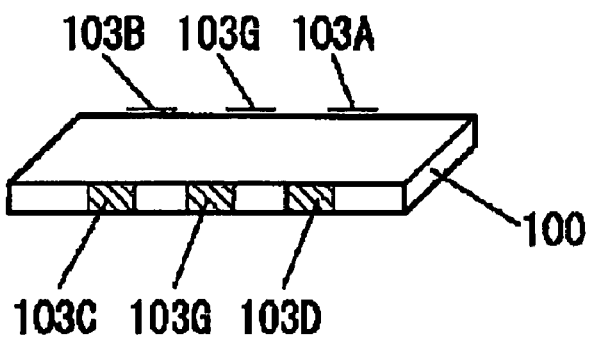
FIG. 17($a$) is a perspective view of a piezoelectric element, and FIG. 17($b$) is an exploded perspective view of the piezoelectric element.
Figure 17B:
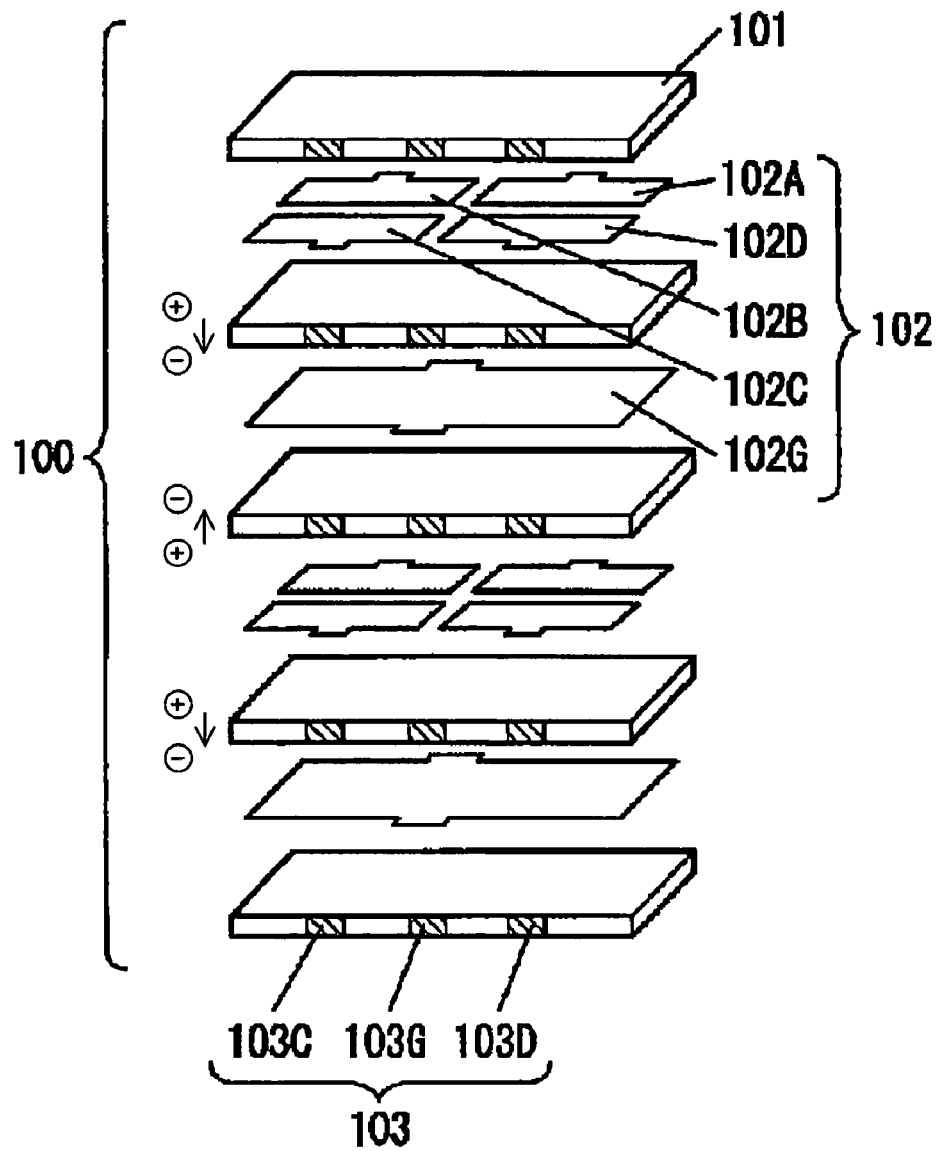

In the above embodiments, a movable object 9 driven by applying the driving force of an ultrasonic actuator to the movable object 9 is flat-shaped. However, this is not restrictive. Any structure can be adopted as the structure of the movable object 9. For example, as illustrated in FIG. 15, the movable object may be a disk 9 rotatable about the predetermined axis X, and drivers 8, 8 of an ultrasonic actuator may abut against the edge surface 9a of the disk 9. When an ultrasonic actuator of this structure is driven, a generally elliptical motion of the drivers 8, 8 allows the disk 9 to rotate about the predetermined axis X.

In the above embodiments, the configuration in which drivers 8, 8 are placed on one end surface of each of piezoelectric elements 12, 21, 23, and 33 was described. However, drivers 8, 8 may be placed on one side surface of each piezoelectric elements 12, 21, 23, 33. In this case, while the directions in which the piezoelectric element is stretched in a primary mode of a stretching vibration correspond to the direction in which the drivers 8, 8 support a movable object 9, the vibration direction associated with a secondary mode of a bending vibration corresponds to the direction in which the movable object 9 can move.

In the above embodiments, a supporter is composed of a case 11. However, as long as an ultrasonic actuator has supporting members for supporting each piezoelectric element 12, 21, 23, 33, the supporter may be composed of any element.

INDUSTRIAL APPLICABILITY

As described above, when, according to the present invention, the configuration of feed electrode layers is devised, this restrains vibration of a piezoelectric element from being inhibited. The present invention is useful for ultrasonic actuators for use in various electronic devices and other devices or the like.

The invention claimed is:
1. A piezoelectric element obtained by alternately stacking generally rectangular piezoelectric layers and internal electrode layers, wherein
the internal electrode layers include a common electrode layer and feed electrode layers alternately placed in a stacking direction with the piezoelectric layers interposed between the common electrode layer and the feed electrode layers,
the common electrode layer has a common electrode,
the feed electrode layers include a first feed electrode layer disposed on a principal surface of one of the piezoelec- tric layers and a second feed electrode layer disposed on a principal surface of one of the piezoelectric layers different from the piezoelectric layer on the principal surface of which the first feed electrode layer is disposed, the first feed electrode layer has a pair of electrically continuous first electrodes disposed on two areas opposed along a first-diagonal-line direction of the principal surface of the associated piezoelectric layer among four areas defined by dividing the principal surface of the associated piezoelectric layer into two parts in the longitudinal and transverse directions, the second feed electrode layer has a pair of electrically continuous second electrodes disposed on two areas opposed along a second-diagonal-line direction of the principal surface of the associated piezoelectric layer among the four areas, and the common electrode, the first electrodes, and the second electrodes are connected to associated external electrodes disposed on outer surfaces of the piezoelectric element.

2. The piezoelectric element of claim 1, wherein the first feed electrode layer has, in addition to the pair of first electrodes, a first side electrode disposed on one of the two areas opposed along the second-diagonal-line direction, the second feed electrode layer has, in addition to the pair of second electrodes, a second side electrode disposed on one of the two areas opposed along the first-diagonal-line direction, the first electrodes are connected through an associated one of the external electrodes to the second side electrode, and the second electrodes are connected through an associated one of the external electrodes to the first side electrode.

3. The piezoelectric element of claim 1, wherein the first feed electrode layer has, in addition to the pair of first electrodes, a pair of first side electrodes disposed on the two areas opposed along the second-diagonal-line direction, respectively, the second feed electrode layer has, in addition to the pair of second electrodes, a pair of second side electrodes disposed on the two areas opposed along the first-diagonal-line direction, respectively, the first electrodes are connected through associated ones of the external electrodes to the second side electrodes, and the second electrodes are connected through associated ones of the external electrodes to the first side electrodes.

4. The piezoelectric element of claim 1, wherein the shape of each said feed electrode layer is generally point-symmetric with respect to the central point of a principal surface of an associated one of the piezo electric layers.

5. The piezoelectric element of claim 1, wherein the shape of the first feed electrode layer and the shape of the second feed electrode layer are identical with each other but inverse to each other with respect to the central line extending along a longitudinal direction of the principal surface of each said piezoelectric layer.

6. The piezoelectric element of claim 1, wherein the number of first feed electrode layers is equal to that of second feed electrode layers.

7. The piezoelectric element of claim 1, wherein the feed electrode layers are configured such that the first feed electrode layer and the second feed electrode layer are alternately placed in a stacking direction.

8. The piezoelectric element of claim 1, wherein the outermost layers of the piezoelectric element are the piezoelectric layers.

9. The piezoelectric element of claim 1, wherein the external electrodes are disposed only on the surrounding surfaces of the piezoelectric element including the end and side surfaces of the piezoelectric element.

10. An ultrasonic actuator comprising:

the piezoelectric element of claim 1;

a driver disposed on an end or side surface of the piezoelectric element; and a movable object supported by the driver, wherein the power supply to the internal electrode layers allows the piezoelectric element to create a vibration produced by synthesizing a primary mode of a stretching vibration and a secondary mode of a bending vibration, and the vibration allows the driver to produce a generally elliptical motion, thereby moving the movable object relative to the piezoelectric element.

11. The ultrasonic actuator of claim 10 further comprising a supporter having a supporting member for supporting a piezoelectric element, the supporting member being made of conductive rubber.

* * * * *